United States Patent
Fukayama et al.

(10) Patent No.: US 9,448,065 B2
(45) Date of Patent: Sep. 20, 2016

(54) MANUFACTURING METHOD OF SEMICONDUCTOR DEVICE AND SEMICONDUCTOR MANUFACTURING APPARATUS

(71) Applicant: KABUSHIKI KAISHA TOSHIBA, Tokyo (JP)

(72) Inventors: Shinya Fukayama, Naoya Aichi (JP); Yukifumi Oyama, Yokkaichi Mie (JP); Kazuhiro Murakami, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/636,081

(22) Filed: Mar. 2, 2015

(65) Prior Publication Data
US 2016/0079102 A1    Mar. 17, 2016

(30) Foreign Application Priority Data
Sep. 16, 2014  (JP) ................... 2014-187676

(51) Int. Cl.
*G08B 21/00* (2006.01)
*G01B 11/26* (2006.01)
(Continued)

(52) U.S. Cl.
CPC ............. *G01B 11/26* (2013.01); *G01B 11/272* (2013.01); *G08B 21/086* (2013.01);
(Continued)

(58) Field of Classification Search
CPC .............. H01L 21/67259; H01L 25/0657; H01L 24/75; H01L 22/20; H01L 24/81; H01L 25/50; H01L 21/683; H01L 23/544; H01L 2225/06593; H01L 2224/81191; H01L 2225/06513; H01L 2224/75753; H01L 2224/8113; H01L 21/681; G08B 21/086; G01B 11/272

USPC ........... 340/686.1, 686.2; 356/400, 618, 138, 356/401, 620; 438/5, 108
See application file for complete search history.

(56) References Cited

U.S. PATENT DOCUMENTS

| 8,244,399 B2 * | 8/2012 | Maeda ............. H01L 21/67092 156/60 |
| 2003/0143761 A1 * | 7/2003 | Fukuda ................. H01L 23/544 438/7 |

(Continued)

FOREIGN PATENT DOCUMENTS

| JP | 2002314040 A | 10/2002 |
| JP | 2005175263 A | 6/2005 |

OTHER PUBLICATIONS

Taiwan Office Action dated May 6, 2016, filed in Taiwan counterpart Application No. 104107090, 10 pages (with translation).

*Primary Examiner* — Anh V La
(74) *Attorney, Agent, or Firm* — Patterson & Sheridan, LLP

(57) ABSTRACT

A method for manufacturing a semiconductor device includes determining a position of a first semiconductor chip having a plurality of first electrodes, using one or more first alignment marks formed on the first semiconductor chip, determining a position of a second semiconductor chip having a plurality of second electrodes, using one or more second alignment marks formed on the second semiconductor chip, moving the second semiconductor chip relative to the first semiconductor chip, based on the determined positions of the first and second semiconductor chips, such that the second electrodes are aligned with the first electrodes, after said moving, stacking the second semiconductor chip on the first semiconductor chip, such that the first electrodes are electrically connected to the second electrodes, and calculating a misalignment amount between the first semiconductor chip and the second semiconductor chip stacked thereon.

16 Claims, 8 Drawing Sheets

(51) Int. Cl.
  *H01L 23/544*  (2006.01)
  *H01L 25/00*  (2006.01)
  *H01L 25/065*  (2006.01)
  *H01L 23/00*  (2006.01)
  *H01L 21/66*  (2006.01)
  *G08B 21/08*  (2006.01)
  *H01L 21/68*  (2006.01)
  *G01B 11/27*  (2006.01)

(52) U.S. Cl.
  CPC ............ H01L 21/681 (2013.01); H01L 22/20 (2013.01); H01L 23/544 (2013.01); H01L 24/75 (2013.01); H01L 24/81 (2013.01); H01L 25/0657 (2013.01); H01L 25/50 (2013.01); *H01L 2223/54426* (2013.01); *H01L 2224/75753* (2013.01); *H01L 2224/75804* (2013.01); *H01L 2224/8113* (2013.01); *H01L 2224/8116* (2013.01); *H01L 2224/81191* (2013.01); *H01L 2225/06513* (2013.01); *H01L 2225/06593* (2013.01)

(56) References Cited

U.S. PATENT DOCUMENTS

| | | |
|---|---|---|
| 2004/0023466 A1 | 2/2004 | Yamauchi |
| 2012/0127485 A1* | 5/2012 | Yamauchi ............... H01L 24/75 356/614 |
| 2013/0105558 A1* | 5/2013 | Abe ..................... B23K 1/0016 228/179.1 |
| 2013/0250298 A1 | 9/2013 | Komuta et al. |

* cited by examiner

MANUFACTURING METHOD OF SEMICONDUCTOR DEVICE AND SEMICONDUCTOR MANUFACTURING APPARATUS

CROSS-REFERENCE TO RELATED APPLICATION

This application is based upon and claims the benefit of priority from Japanese Patent Application No. 2014-187676, filed Sep. 16, 2014, the entire contents of which are incorporated herein by reference.

FIELD

Embodiments described herein relate generally to a manufacturing method of a semiconductor device and a semiconductor manufacturing apparatus.

BACKGROUND

One type of a semiconductor device includes a plurality of semiconductor chips stacked in one package. Such a semiconductor device can reduce a size of the device.

In such a semiconductor device, a plurality of micro bumps are formed on each of the semiconductor chips, and the bumps enable transmission of an electrical signal between the semiconductor chips to be at a fast speed. When a semiconductor chip including the micro bumps are stacked onto another semiconductor chip including the micro bumps, alignment marks formed on the semiconductor chips are checked by a camera, and the semiconductor chips are aligned based on captured images. Then, the stacked semiconductor chips are connected by applying heat, compression force, ultrasonic waves, or the like thereto. However, the stacked semiconductor chips may still be misaligned.

DETAILED DESCRIPTION

Figure 1:
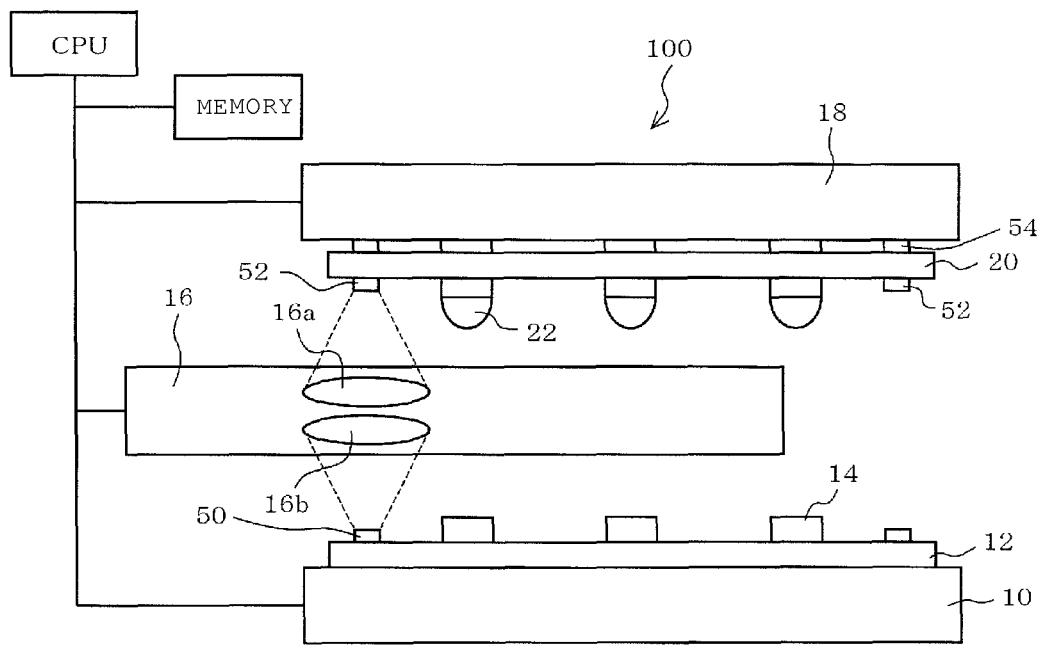
FIG. 1 illustrates a semiconductor manufacturing apparatus according to a first embodiment that is capturing images of first and second semiconductor chips during a process of manufacturing a semiconductor device.

In general, according to one embodiment, a method for manufacturing a semiconductor device includes determining a position of a first semiconductor chip having a plurality of first electrodes, using one or more first alignment marks formed on the first semiconductor chip, determining a position of a second semiconductor chip having a plurality of second electrodes, using one or more second alignment marks formed on the second semiconductor chip, moving the second semiconductor chip relative to the first semiconductor chip, based on the determined positions of the first and second semiconductor chips, such that the second electrodes are aligned with the first electrodes, after said moving, stacking the second semiconductor chip on the first semiconductor chip, such that the first electrodes are electrically connected to the second electrodes, and calculating a misalignment amount between the first semiconductor chip and the second semiconductor chip stacked thereon.

Hereinafter, exemplary embodiments will be described with reference to drawings. The drawings are schematic, and a relationship between a thickness and a planar dimension, a ratio of thickness of each layer, and the like do not necessarily coincide with an actual one. Even when representing the same component, a dimension or a ratio is sometimes differently represented in each drawing. Moreover, a vertical or a horizontal direction indicates a relative direction when a circuit formation surface side in a semiconductor substrate or a placement side of the semiconductor substrate of a stage in a semiconductor manufacturing apparatus is set to be a top, and does not necessarily coincide with a direction based on a direction of gravitational acceleration. In the disclosure, the same numerals are used for the same element which is previously described in the drawings to appropriately omit a detailed description thereof.

(First Embodiment)

Figure 4:
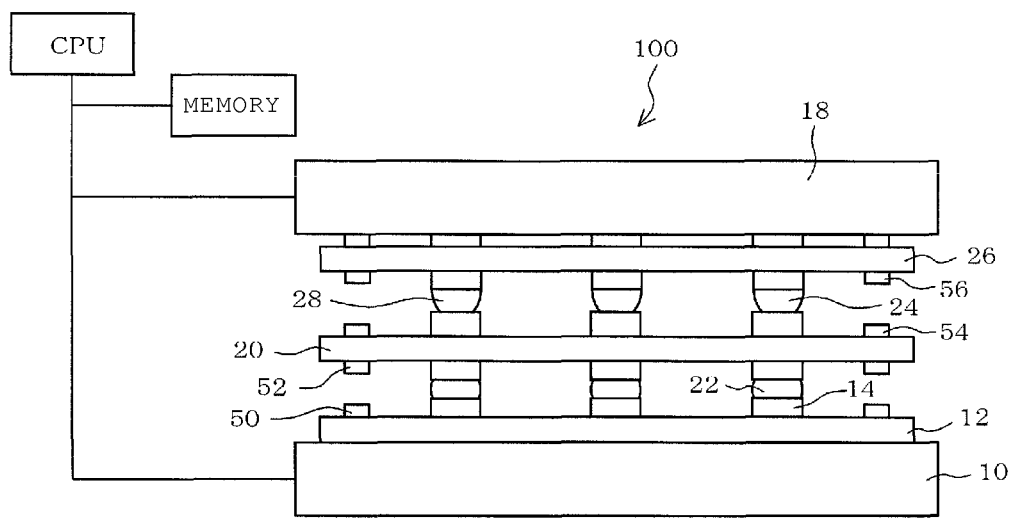
FIG. 4 illustrates the semiconductor manufacturing apparatus that is stacking the third semiconductor chip onto the second semiconductor chip.
Figure 5:
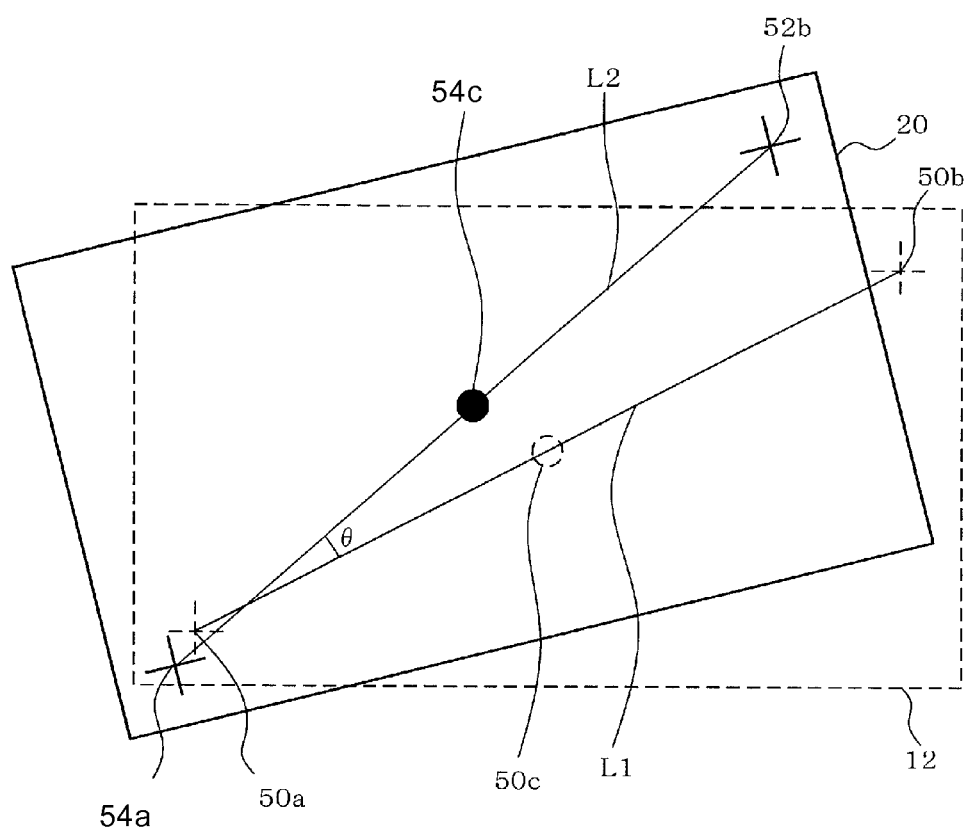
FIG. 5 is an example of a top view of the first semiconductor chip and the second semiconductor chip stacked onto the first semiconductor chip.
Figure 6A:
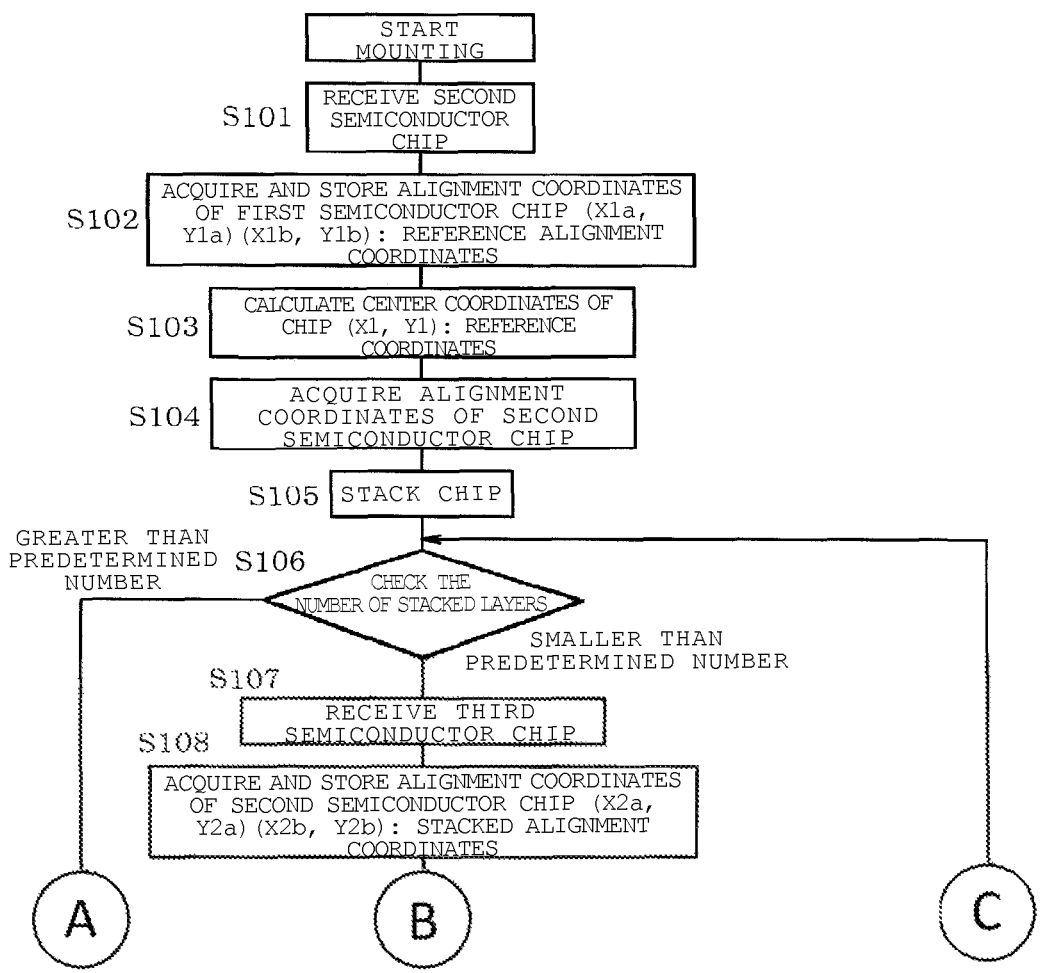
FIGS. 6A and 6B are examples of flowcharts illustrating a procedure of a method of manufacturing a semiconductor device according to the first embodiment.
Figure 6B:
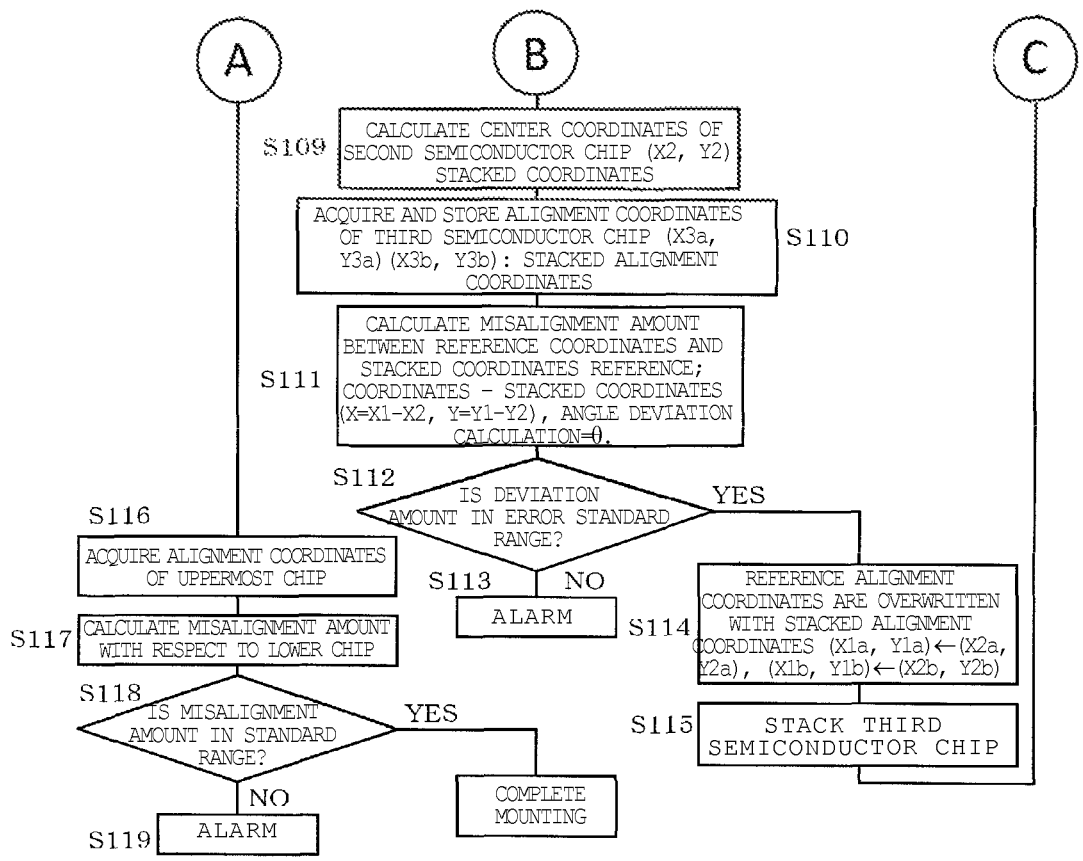
Figure 7:
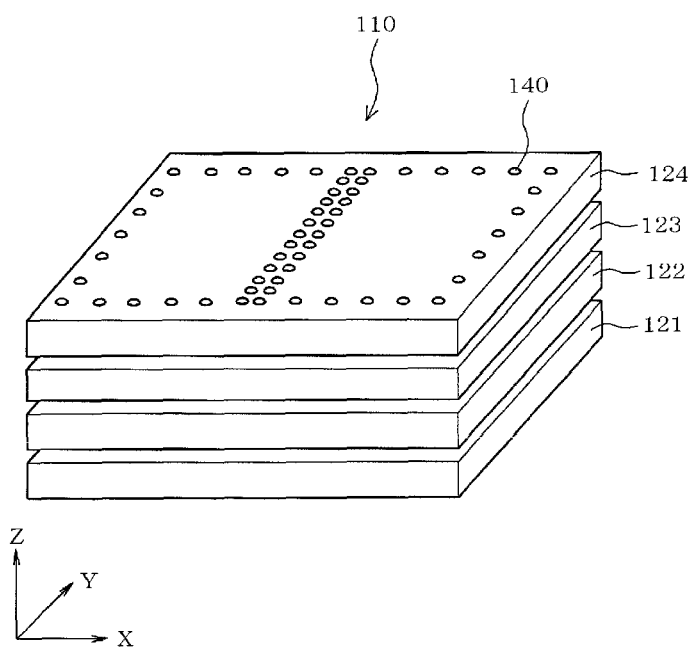
FIG. 7 is an example of a perspective view of the semiconductor device manufactured through the method.

In a following, a first embodiment will be described with reference to FIGS. 1 to 7. FIGS. 1 to 4 are examples of diagrams illustrating a semiconductor manufacturing apparatus 100 during a manufacturing process of a semiconductor device according to the first embodiment when viewed from a transverse direction. FIG. 5 is an example of a top view of a first semiconductor chip 12 and a second semiconductor chip 20 stacked on the first semiconductor chip 12 viewed from a top, and is an example of a view which schematically shows a positional misalignment after the second semiconductor chip 20 is stacked onto the first semiconductor chip 12. FIGS. 6A and 6B are examples of flow charts of the method of manufacturing a semiconductor device according to the first embodiment. FIG. 7 is an example of a perspective view of a semiconductor device 110.

First, in a method of manufacturing a semiconductor device according to the first embodiment, when starting a stacking, the first semiconductor chip 12 is suctioned and held onto a stage 10 of the semiconductor manufacturing apparatus 100 as illustrated in FIG. 1. Alignment marks 50 and bumps 14 are formed on an upper surface of the first semiconductor chip 12.

Then, the semiconductor manufacturing apparatus 100 receives the second semiconductor chip 20 (step 101). The second semiconductor chip 20 is set such that a surface on which bumps 22 are formed is a lower side, and is suctioned and held by a head 18. On a lower surface of the second semiconductor chip 20, alignment marks 52 and the bump 22s are formed in advance.

The first semiconductor chip 12 and the second semiconductor chip 20 are held so that the bumps 14 and the bumps 22 face each other, and a camera 16 is disposed therebetween. The camera 16 includes lenses 16a and 16b, and is disposed so as to capture an image of the alignment marks 50 and 52 through the lenses 16a and 16b. The semiconductor manufacturing apparatus 100 can capture the image of the alignment marks 50 and 52 using the camera 16, and identify alignment coordinates of the chips. The stage 10, the head 18, and the camera 16 are a part of the semiconductor manufacturing apparatus 100 according to the first embodiment. In addition, the semiconductor manufacturing apparatus 100 includes a memory unit which stores coordinate data and the like, a CPU unit (calculation unit, control unit) which performs a calculation using the coordinate data, and a control and the like of the stage 10, the head 18, the camera 16, and the like.

Here, the semiconductor manufacturing apparatus 100 recognizes and acquires alignment coordinates 50a and 50b of the alignment mark 50 of the first semiconductor chip 12 using the camera 16 and stores coordinate data in the memory unit (step 102). For example, two of the alignment marks 50 are provided on the first semiconductor chip 12. The alignment coordinates 50a are set to be (X1a, Y1a), and the alignment coordinates 50b are set to be (X1b, Y1b). The alignment coordinates 50a and 50b are stored as "reference alignment coordinates." Here, the "reference alignment coordinates" mean coordinates on the first semiconductor chip 12, which is a reference for aligning positions, when the second semiconductor chip 20 is stacked thereon. At a time of the stacking, alignment coordinates of a stacked chip (described below) is aligned with the "reference alignment coordinates." Here, as illustrated in FIG. 5, the alignment marks 50 are disposed at an upper right corner and a lower left corner of the first semiconductor chip 12. However, the alignment marks are not necessarily disposed at these places, and may be disposed at any place.

Then, center coordinates of the alignment coordinates are calculated using the coordinates (step 103). Center coordinates 50c are set to be (X1, Y1). The center coordinates 50c of the first semiconductor chip 12 are stored as "reference coordinates." The reference coordinates serve as a reference point for calculating a misalignment amount and the like (described below). Here, X1=(X1a+X1b)/2, and Y1=(Y1a+Y1b)/2. That is, the center coordinates 50c indicate a midpoint of a line segment L1 connecting the alignment coordinates 50a and 50b. Here, the center coordinates of the alignment coordinates are used as the reference coordinates; however, the embodiment is not limited thereto. A reference point (reference coordinates) may be located at any place and a misalignment amount may be calculated based on the coordinates. In addition, a plurality of the reference coordinates may be prepared.

Then, the semiconductor manufacturing apparatus 100 recognizes and acquires alignment coordinates 52a and 52b of the alignment marks 52 of the second semiconductor chip 20 using the camera 16 (step 104). For example, two of the alignment marks 52 are provided on the lower surface of the second semiconductor chip 20, and one is set to be the alignment coordinates 52a and the other is set to be the alignment coordinates 52b. The alignment coordinates 52a are set to be (X2a, Y2a), and the alignment coordinates 52b are set to be (X2b, Y2b).

Figure 2:
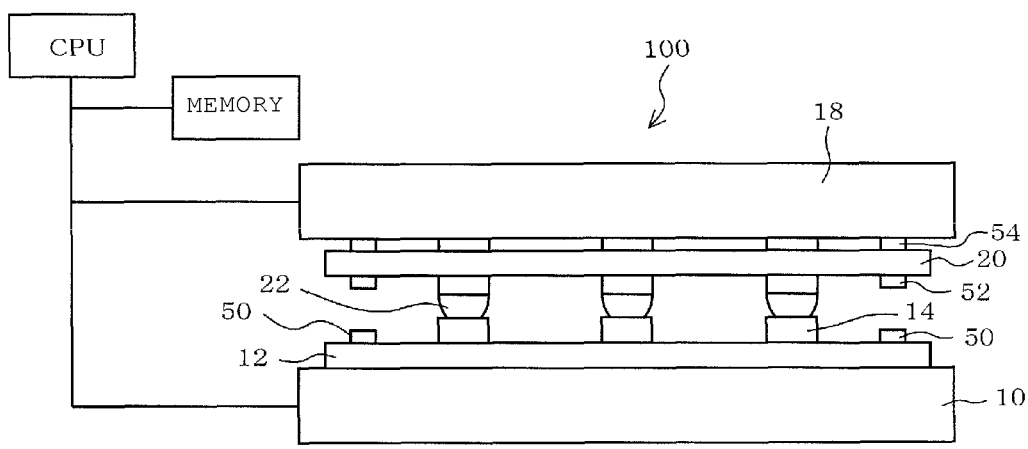
FIG. 2 illustrates the semiconductor manufacturing apparatus that is stacking the second semiconductor chip onto the first semiconductor chip.

Then, the semiconductor manufacturing apparatus 100 performs a control using these alignment coordinates to align the bumps 14 provided on the upper surface of the first semiconductor chip 12 with the bumps 22 provided on the lower surface of the second semiconductor chip 20, and then performs a compression bonding while applying heat, compression force, or ultrasonic waves to the second semiconductor chip 20. Accordingly, as illustrated in FIG. 2, the bumps 14 and the bumps 22 are connected to each other (step 105).

Then, the semiconductor manufacturing apparatus 100 checks the number of stacked layers (step 106). When the number of stacked layers is less than a predetermined number of stacked layers, the head 18 of the semiconductor manufacturing apparatus 100 receives a third semiconductor chip 26 to be stacked next as illustrated in FIG. 3 (step 107).

Then, the semiconductor manufacturing apparatus 100 recognizes and acquires alignment coordinates 54a and 54b of alignment marks 54 provided on an upper surface of the second semiconductor chip 20 using the camera 16 and stores coordinate data (step 108). For example, two of the alignment marks 54 are provided on the upper surface (an upper surface in a Z direction in a figure) of the second semiconductor chip 20. One is set to be the alignment coordinates 54a, and the other is set to be the alignment coordinates 54b. The alignment coordinates 54a are set to be (X2a, Y2a), and the alignment coordinates 54b are set to be (X2b, Y2b). The semiconductor manufacturing apparatus 100 stores the alignment coordinates 54a and 54b as "stacked alignment coordinates." The stacked alignment coordinates are alignment coordinates on a stacked chip.

Then, the semiconductor manufacturing apparatus 100 calculates center coordinates of the chip using the coordinates (step 109). Center coordinates 54c are set to be (X2, Y2). The center coordinates 54c of the second semiconductor chip are stored as "stacked coordinates." The stacked coordinates are used for calculating a misalignment amount and the like (described below). Here, the stacked coordinates are X2=(X2a+X2b)/2 and Y2=(Y2a+Y2b)/2. The center coordinates 54c indicate a midpoint of a line segment L2 connecting the alignment coordinates 54a and 54b. These coordinates are coordinates of the second semiconductor chip 20 after being stacked and fixed onto the first semiconductor chip 12. Accordingly, there may be a misalignment between the first and second semiconductor chips when applying heat, compression force, or ultrasonic waves. That is, there may be a misalignment with respect to alignment coordinates acquired earlier.

Figure 3:
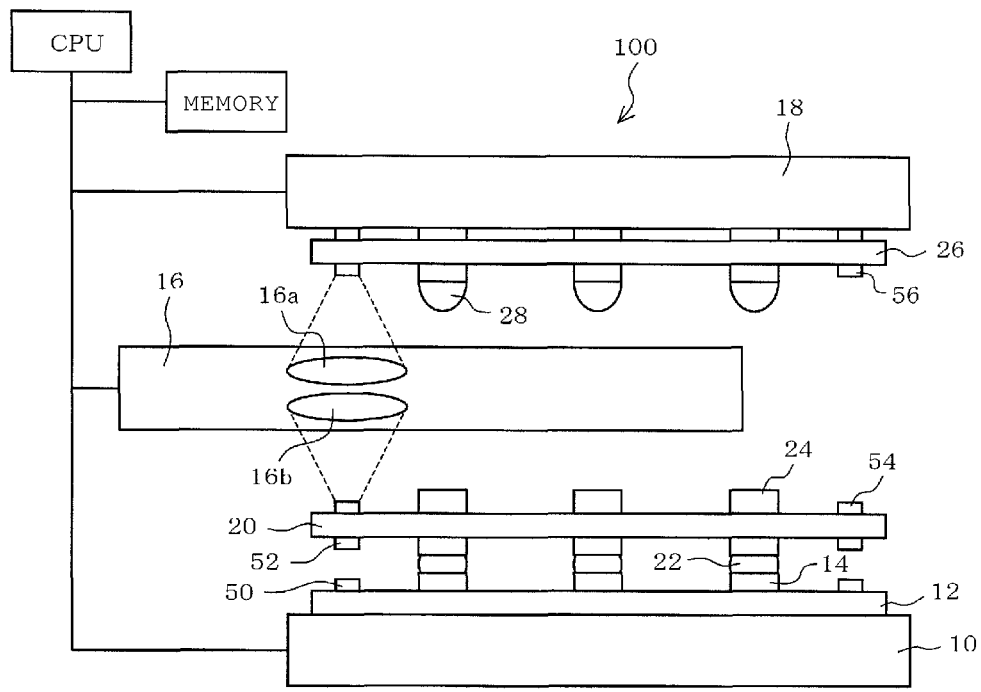
FIG. 3 illustrates the semiconductor manufacturing apparatus that is capturing images of second and third semiconductor chips.

Then, as illustrated in FIG. 3, the semiconductor manufacturing apparatus 100 recognizes and acquires alignment coordinates 56a and 56b of an alignment marks 56 of the third semiconductor chip 26 using the camera 16 (step 110). For example, two of the alignment marks 56 are provided on a lower surface of the third semiconductor chip 26. One is set to be the alignment coordinates 56a, and the other is set to be the alignment coordinates 56b. Here, the alignment coordinates 56a are set to be (X3a, Y3a), and the alignment coordinates 56b are set to be (X3b, Y3b). The alignment coordinates 56a and 56b may be disposed at any place.

Then, the semiconductor manufacturing apparatus 100 calculates a positional misalignment amount (X=X1-X2, Y=Y1-Y2) between the reference coordinates (X1, Y1) of the first semiconductor chip 12 and the stacked coordinates (X2, Y2) of the second semiconductor chip 20, and an angle misalignment amount θ (step 111). Accordingly, it is possible to obtain a misalignment amount (X, Y, θ).

Then, the semiconductor manufacturing apparatus 100 determines whether or not the misalignment amount is in a standard range (step 112). When the misalignment amount is out of the standard range, the semiconductor manufacturing apparatus 100 generates an alarm (step 113). Here, the standard range may be set to be, for example, a range in which a connection failure between the bump 14 and the bump 22 is not likely to occur. When the misalignment amount is out of the standard range, a connection failure between the first semiconductor chip 12 and the second semiconductor chip 20 may occur. Thus, it is possible to generate an alarm when the misalignment amount is out of the standard range by calculating the misalignment amount for each stacking. Accordingly, a subsequent stacked chip is not wasted, and thereby it is possible to reduce a cost.

Alternatively, in response to the alarm, a determination whether or not to continue a stacking of a semiconductor chip may be performed after checking a connection state of bumps. To generate the alarm, it is possible to display a message indicating that an error occurs on an appropriate display unit and the like or generate a warning sound and the like. Accordingly, when there is a high possibility that a failure occurs in a stacking of a semiconductor chip in a middle phase of the stacking, a subsequent stacking is not continued. Therefore, it is possible to reduce a cost. Here, as a semiconductor chip after the third semiconductor chip 26 is not wasted, it is possible to reduce a cost.

On the other hand, when the misalignment amount is in the standard range, the semiconductor manufacturing apparatus 100 sets the stacked alignment coordinates of the second semiconductor chip 20 to be new coordinate data of the reference alignment coordinates, and performs overwriting (substitution) (step 114). That is, the alignment coordinates 50a (X1a, Y1a) and 50b (X1b, Y1b) are replaced with the alignment coordinates 54a (X2a, Y2a) and 54b (X2b, Y2b), and thereby the alignment coordinates 54a (X2a, Y2a) and 54b (X2b, Y2b) are set to new reference alignment coordinates.

Alternatively, the center coordinates 54c (mounted coordinates) of the alignment marks 54 of the second semiconductor chip 20 may be overwritten (substituted) as reference coordinates. That is, the center coordinates 50c (X1, Y1) may be replaced with the center coordinates 54c (X2, Y2).

Then, the semiconductor manufacturing apparatus 100 performs a control so as to align the alignment coordinates 56a and 56b of the third semiconductor chip 26 recognized and acquired in step 110 with the reference alignment coordinates 54a and 54b, and aligns bumps 24 provided on the upper surface of the second semiconductor chip 20 with bumps 28 provided on a lower side of the third semiconductor chip 26. Thereafter, heat, compression force, or ultrasonic waves are applied to the second semiconductor chip 20 to crimp the bumps 24 and the bumps 28. Accordingly, as illustrated in FIG. 4, the bumps 24 and the bumps 28 are connected to each other, and thereby a stacking of the third semiconductor chip 26 is performed (step 115). Accordingly, the third semiconductor chip 26 is stacked on the second semiconductor chip 20. At this time, there may be a misalignment between the second semiconductor chip 20 and the third semiconductor chip 26 due to the heat, compression force, or the ultrasonic waves which are applied.

Then, the number of stacked layers is checked (step 106). When the number of stacked layers is less than the predetermined number of stacked layers, as illustrated in FIG. 3, the head 18 receives a semiconductor chip to be subsequently stacked (step 107). Thereafter, until the number of stacked semiconductor chips reaches the predetermined number of stacked layers, a flow from step 107 to step 106 via step 115 is repeated.

Next, in step 106, when the number of stacked semiconductor chips reaches the predetermined number of stacked layers, and the stacking of the predetermined number is completed, alignment coordinates of alignment marks provided on an upper surface of a top semiconductor chip (hereinafter, referred to as an uppermost chip) are acquired (step 116).

Then, a misalignment amount with respect to alignment coordinates of a semiconductor chip (hereinafter, referred to as a lower chip) one layer below the uppermost chip is calculated (step 117). The alignment coordinates of the lower chip (that is, reference alignment coordinates) are acquired and stored in step 108, and the reference coordinates are calculated in step 109.

Then, a determination whether or not the misalignment amount is in the standard range is performed (step 118). When the misalignment amount is out of the standard range, the alarm is generated (step 119). To generate the alarm, it is possible to display a message indicating that an error occurs on an appropriate display unit or generate a warning sound. Using the alarm, it is possible to show that a misalignment amount between the uppermost chip and the lower chip is large to have a connection failure. On the other hand, when the misalignment amount is in the criterion, the stacking is completed.

It is possible to manufacture the semiconductor device 110 according to the first embodiment through the above processes. The semiconductor manufacturing apparatus 100 according to the first embodiment performs a control described above on the stage 10, the head 18, and the camera 16, whereby it is possible to manufacture the semiconductor device according to the first embodiment.

FIG. 7 is an example of a perspective view of the semiconductor device 110 manufactured according to the first embodiment. As illustrated in FIG. 7, semiconductor chips 121, 122, 123, and 124 are stacked in the Z direction. Bumps 140 are formed on the semiconductor chip 124, which is an uppermost chip. Metal electrodes (not shown) extend in the Z direction under the bumps 140, and penetrate through the semiconductor chips 121, 122, 123, and 124. The metal electrode electrically connects the semiconductor chips to each other. In FIG. 7, four semiconductor chips are stacked. However, the embodiment is not limited thereto, and the number of stacked chips may be arbitrarily set. A semiconductor device 110 according to a second embodiment (described below) also has the same configuration.

In the first embodiment, step 110 of recognizing and acquiring the alignment coordinates 56a and 56b of the alignment marks 56 of the third semiconductor chip 26 is performed after step 109, but the step 110 may be performed in any order. That is, the step 110 may be performed before step 115 of performing a stacking of the third semiconductor chip 26, and may be performed after, for example, step 114. The step 110 may be performed at the same time as an acquisition of the alignment coordinates of the second semiconductor chip 20 in step 108. For example, when the camera 16 vertically includes the lenses 16a and 16b, a process time may be reduced. In addition, a reception (step 107) of the third semiconductor chip 26 does not need to be performed right after step 106, and may be performed between any of steps 107 to 115 before an acquisition of the alignment coordinates (step 110) of the third semiconductor chip 26.

As described above, in the first embodiment, a positional misalignment amount (X, Y, θ) of the stacked chips is calculated based on center coordinates (reference coordinates) of a semiconductor chip of two layers below and center coordinates (stacked coordinates) of a semiconductor chip of one layer below for each stacking of a semiconductor chip. Then, it is determined whether or not the misalignment amount is in the standard range, and when the misalignment amount is out of the standard range, a stacking process is stopped and an alarm is generated without performing a stacking of a next semiconductor chip. Accordingly, a failure in the middle of a stacking is detected and a subsequent stacking is stopped, and thereby the stacking is not continued. As a result, a semiconductor chip is not wastefully stacked, and it is possible to reduce a cost. That is, it is possible to prevent a manufacture of a semiconductor device which already has a misalignment amount out of the standard range from being continued.

(Second Embodiment)

A second embodiment will be described referring to FIGS. 1 to 5, 7, and 8. Configuration of the semiconductor device 110 according to the second embodiment is the same as that according to the first embodiment, and is shown in FIGS. 1 to 5. The configuration (perspective view) of the semiconductor device 110 after being stacked is the same as the configuration as illustrated in FIG. 7 described above.

Figure 8A:
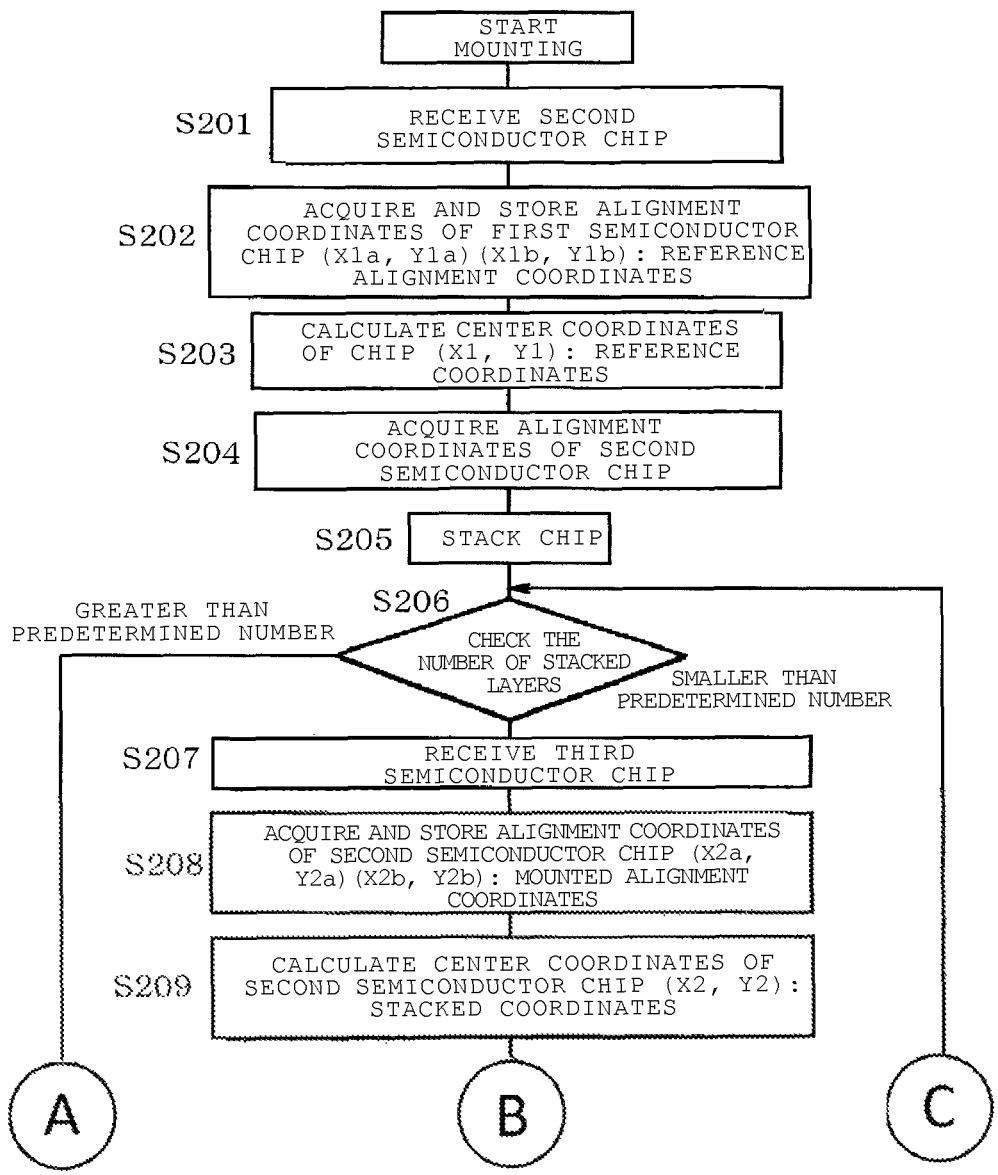
FIGS. 8A and 8B are examples of flow charts illustrating a procedure of a method of manufacturing a semiconductor device according to a second embodiment.
Figure 8B:
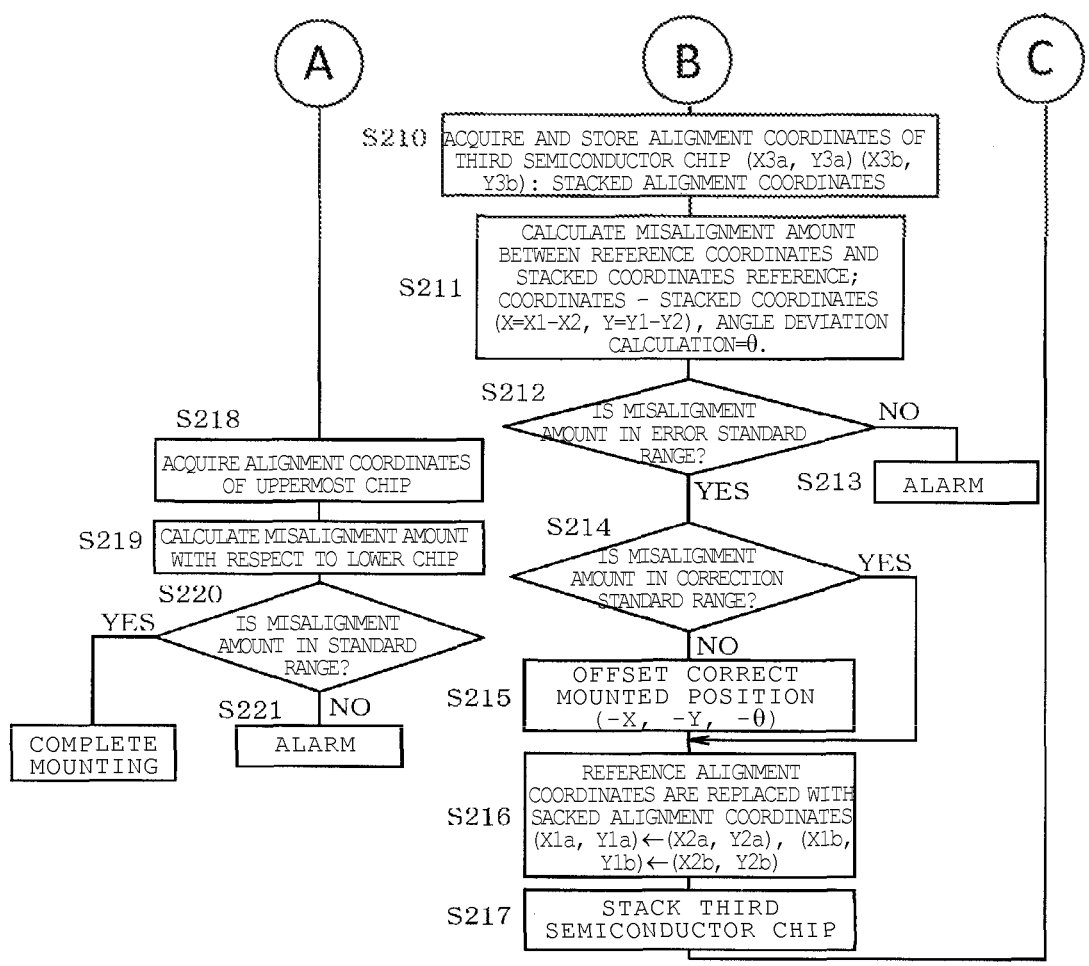

FIGS. 8A and 8B are examples of flow charts which show a procedure of the method of manufacturing the semiconductor device according to the second embodiment. First, in the manufacturing method of the semiconductor device according to the embodiment, steps 201 to 211 are the same as steps 101 to 111 in the first embodiment.

In the second embodiment, after performing steps 201 to 211, it is determined whether or not the misalignment amount is in an error standard range (step 212). When the misalignment amount is out of the error standard range, an alarm is generated (step 213). The error standard range may be set to be, for example, a range in which a connection failure between the bumps 14 and the bumps 22 is not likely to occur. In contrast, when the misalignment amount is out of the error standard range, the connection failure between the first semiconductor chip 12 and the second semiconductor chip 20 may occur.

To generate an alarm, for example, it is possible to display a message indicating that an error occurs on an appropriate display or generate a warning sound. By calculating a misalignment amount caused by a stacking for each stacking, when a misalignment amount which is out of the criterion during the stacking, the alarm may be generated. Accordingly, a subsequent stacking is not performed, such that a subsequent stacked chip is not wasted and it is possible to reduce a cost. Here, the third semiconductor chip 26 and a subsequent semiconductor chip are not wasted, so that it is possible to reduce a cost for a semiconductor chip scheduled for a stacking thereafter or for a sealing process and the like after the stacking is completed.

On the other hand, when the misalignment amount is in the error standard range, it is determined whether or not the misalignment amount is in a correction standard range (step 214). The correction standard range is smaller than the error standard range.

When the misalignment amount is out of the correction standard range, the coordinate data of the stacked alignment coordinates (alignment coordinates of the second semiconductor chip 20) acquired in step 208 is replaced with the positional misalignment amount (X, Y, θ) calculated in step 210 (step 215). That is, a correction amount (−X, −Y, −θ) is added to coordinate data of the stacked alignment coordinates (that is, the misalignment amount is subtracted). Then, coordinate data of reference alignment coordinates is replaced with the coordinate data of the stacked alignment coordinates after the correction, and the coordinate data of the stacked alignment coordinates is set as new coordinate data of reference alignment coordinates (step 216).

On the other hand, in step 214, when the misalignment amount is in the correction standard range, coordinate data of reference alignment coordinates is replaced with coordinate data of the alignment coordinates (stacked alignment coordinates) of the second semiconductor chip 20, and the coordinate data of the alignment coordinates of the second semiconductor chip is set as new coordinate data of reference alignment coordinates (step 216). That is, the reference alignment coordinates 50a (X1a, Y1a) and 50b (X1b, Y1b) of the first semiconductor chip 12 are replaced (substituted) with the stacked alignment coordinates 54a (X2a, Y2a) and 54b (X2b, Y2b) of the second semiconductor chip 20, and the stacked alignment coordinates 54a and 54b is set as new coordinate data of reference alignment coordinates.

Alternatively, instead of the above-described method, the stacked coordinates of the second semiconductor chip 20 may be overwritten as reference coordinates. That is, the reference coordinates 50c (X1, Y1) are replaced (substituted) with the stacked coordinates 54c (X2, Y2) of the second semiconductor chip 20, and the stacked coordinates are set as new reference coordinates.

Next, by controlling the semiconductor manufacturing apparatus so that the alignment coordinates 56a and 56b of the third semiconductor chip 26 which are recognized and acquired in step 210 are aligned with the reference alignment coordinates 54a and 54b, the bumps 24 provided on the upper surface of the second semiconductor chip 20 and the bumps 28 provided at the lower side of the third semiconductor chip 26 are aligned. Then, the bumps 24 and the bumps 28 are stacked while applying heat, compression force, or ultrasonic waves to the second semiconductor chip 20. Accordingly, as illustrated in FIG. 4, the bumps 24 and the bumps 28 are connected to each other, and a stacking of the third semiconductor chip 26 is performed (step 217). As a result, the third semiconductor chip 26 is stacked onto the second semiconductor chip 20. At this time, a there may be a misalignment between the second semiconductor chip 2 and the third semiconductor chip 26 due to the heat or the ultrasonic waves which are applied.

Then, the number of stacked layers is checked (step 206). When the number of stacked layers is less than the predetermined number of stacked layers, as illustrated in FIG. 3, the head 18 receives a semiconductor chip to be stacked next (step 207). Then, until the number of semiconductor chips stacked reaches the predetermined number, a flow from step 207 to step 206 through step 217 is repeated.

In contrast, in step 206, when the number of semiconductor chips which are stacked reaches the predetermined number, and stacking of the predetermined number is completed, alignment coordinates of an alignment mark provided on an upper surface of an uppermost semiconductor chip (hereinafter, referred to as a top layer chip) are acquired (step 218). Here, steps 218 to 221 are the same as steps 116 to 119 in the first embodiment, and thus description thereof is omitted.

The semiconductor device 110 according to the second embodiment may be manufactured through the above-described processes. The semiconductor manufacturing apparatus 100 according to the second embodiment performs a control described above on the stage 10, the head 18, and the camera 16, and thereby it is possible to manufacture the semiconductor device according to the second embodiment.

As described above, a method of manufacturing a semiconductor device according to the second embodiment has the same effect as that in the first embodiment. Moreover, when the misalignment amount is out of the correction standard range and in the error standard range, it is possible to correct the stacked alignment coordinates by the misalignment amount (X, Y, θ) calculated in step 210. Accordingly, it is possible to reduce a positional misalignment amount and to reduce a connection failure.

(Other Embodiments)

Embodiments described above may be applied to various semiconductor devices. The embodiments may be applied to, for example, an NAND type or NOR type flash memory, an EPROM, a DRAM, an SRAM, other semiconductor memory devices, various logic devices, or other semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    determining a position of a first semiconductor chip having a plurality of first electrodes, using one or more first alignment marks formed on the first semiconductor chip;
    determining a position of a second semiconductor chip having a plurality of second electrodes, using one or more second alignment marks formed on the second semiconductor chip;
    moving the second semiconductor chip relative to the first semiconductor chip, based on the determined positions of the first and second semiconductor chips, such that the second electrodes are aligned with the first electrodes;
    after said moving, stacking the second semiconductor chip on the first semiconductor chip, such that the first electrodes are electrically connected to the second electrodes;
    after said stacking, determining an after-stacking position of the second semiconductor chip, using one or more third alignment marks formed on a surface of the second semiconductor chip opposite to a surface on which the one or more second alignment marks are formed; and
    calculating, by a control unit, a misalignment amount between the first semiconductor chip and the second semiconductor chip stacked thereon, based on the position of the first semiconductor chip before said stacking and the after-stacking position of the second semiconductor chip after the said stacking.

2. The method according to claim 1, wherein
    the position of the first semiconductor chip is determined when the first semiconductor chip is placed on a stage such that the first electrodes face the second semiconductor chip, and
    the position of the second semiconductor chip is determined while the second semiconductor chip is held in a holder and moved with respect to the first semiconductor chip.

3. The method according to claim 1, wherein
    the position of the first semiconductor chip is determined based on an image of the first semiconductor chip including the one or more first alignment marks, and
    the position of the second semiconductor chip is determined based on an image of the second semiconductor chip including the one or more second alignment marks.

4. The method according to claim 1, further comprising:
    determining whether or not the misalignment amount is within a predetermined range.

5. The method according to claim 4, further comprising:
    stacking a third semiconductor chip on the second semiconductor chip, when the misalignment is determined to be within the predetermined range.

6. The method according to claim 5, further comprising:
    calculating a misalignment amount between the second semiconductor chip and the third semiconductor chip stacked thereon.

7. The method according to claim 5, further comprising:
    when the misalignment is determined to be within the predetermined range,
    determining a position of the third semiconductor chip, using one or more third alignment marks formed on the third semiconductor chip;
    moving the third semiconductor chip relative to the second semiconductor chip, based on the determined position of the second and third semiconductor chips, such that third electrodes formed on third semiconductor chip are aligned with fourth electrodes formed on the second semiconductor chip, wherein
    the stacking of the third semiconductor chip is carried out after moving the third semiconductor chip, such that the third electrodes are electrically connected to the fourth electrodes.

8. The method according to claim 7, wherein
    the third semiconductor chip is moved to a position such that the misalignment amount between the second and third semiconductor chips offsets the misalignment amount between the first and second semiconductor chips.

9. The method according to claim 7, wherein
    the third semiconductor chip is moved to a position at which there is no misalignment between the first and third semiconductor chips.

10. The method according to claim 1, wherein
    the first and second electrodes are conductive bumps.

11. A semiconductor manufacturing apparatus comprising:
    a stage on which a first semiconductor chip is to be placed;
    a holder configured to hold a second semiconductor chip that is to be stacked on the first semiconductor chip placed on the stage;
    an image capturing unit configured to capture a first image of the first semiconductor chip on the stage before the second semiconductor chip is stacked thereon, the first image including one or more first alignment marks formed on the first semiconductor chip, and a second image of the second semiconductor chip in the holder before stacking on the first semiconductor chip, the second image including one or more second alignment marks formed on the second semiconductor chip; and
    a control unit configured to:
        cause the holder to move relative to the stage, such that the second semiconductor chip can be stacked on the first semiconductor chip,
        calculate a first misalignment amount between the first semiconductor chip and the second semiconductor chip stacked thereon, based on the first and second images, determine whether or not the first misalignment amount is within a predetermined range, cause the holder move relative to the stage to stack the second semiconductor chip on the first semiconductor when the first misalignment amount is within the predetermined range, cause the image capturing unit to capture a third image of the second semiconductor chip stacked on the first semiconductor chip and including one or more third alignment marks formed on a surface of the second semiconductor chip opposite to a surface on which the one or more second alignment marks are formed, and calculate a second misalignment amount between the first semiconductor chip and the second semiconductor chip based on the first and third images.

12. The semiconductor manufacturing apparatus according to claim 11, wherein the control unit is further configured to cause an alarm to be generated when the first misalignment amount is determined to be greater than the predetermined range.

13. The semiconductor manufacturing apparatus according to claim 11, wherein the control unit is further configured to calculate a correction value to be used for stacking of a third semiconductor chip, based on the first misalignment amount, when the first misalignment amount is determined to be within the predetermined range.

14. The semiconductor manufacturing apparatus according to claim 13, wherein the control unit is further configured to position the third semiconductor chip for stacking on the second semiconductor chip according to the correction value.

15. The semiconductor manufacturing apparatus according to claim 11, wherein the control unit is further configured to position a third semiconductor chip for stacking on the second semiconductor chip according to a correction value calculated based on the second misalignment amount.

16. The semiconductor manufacturing apparatus according to claim 11, wherein the control unit is further configured to position a third semiconductor chip for stacking on the second semiconductor chip according to a correction value calculated based on the first misalignment amount.

* * * * *